United States Patent
Pelella et al.

(10) Patent No.: US 7,465,623 B2
(45) Date of Patent: Dec. 16, 2008

(54) METHODS FOR FABRICATING A SEMICONDUCTOR DEVICE ON AN SOI SUBSTRATE

(75) Inventors: Mario M. Pelella, Mountain View, CA (US); Darin A. Chan, Campbell, CA (US)

(73) Assignee: Advanced Micro Devices, Inc., Austin, TX (US)

( * ) Notice: Subject to any disclaimer, the term of this patent is extended or adjusted under 35 U.S.C. 154(b) by 46 days.

(21) Appl. No.: 11/467,634

(22) Filed: Aug. 28, 2006

(65) Prior Publication Data

US 2008/0124884 A1    May 29, 2008

(51) Int. Cl.
*H01L 21/8238* (2006.01)

(52) U.S. Cl. ............... 438/221; 438/199; 438/218; 438/222; 438/232; 438/403; 438/424; 257/E21.642

(58) Field of Classification Search ......... 438/199, 438/403, 424, 435, 447, 449, 451, 519, FOR. 187, 438/FOR. 221, FOR. 227, 218, 221, 222, 438/232; 257/E21.642
See application file for complete search history.

(56) References Cited

U.S. PATENT DOCUMENTS

| | | | | |
|---|---|---|---|---|
| 6,465,283 | B1 * | 10/2002 | Chang et al. | 438/135 |
| 6,686,233 | B2 * | 2/2004 | Soderbarg et al. | 438/217 |
| 6,900,101 | B2 * | 5/2005 | Lin | 438/276 |
| 2005/0059177 | A1 * | 3/2005 | Rhodes | 438/22 |
| 2005/0148131 | A1 * | 7/2005 | Brask | 438/199 |
| 2006/0292782 | A1 * | 12/2006 | Nomura et al. | 438/199 |

* cited by examiner

*Primary Examiner*—Michelle Estrada
(74) *Attorney, Agent, or Firm*—Ingrassia Fisher & Lorenz, P.C.

(57) ABSTRACT

Methods are provided for fabricating an SOI component on a semiconductor layer/insulator/substrate structure including a diode region formed in the substrate. The method comprises, in accordance with one embodiment, forming a shallow trench isolation (STI) region extending through the semiconductor layer to the insulator. A layer of polycrystalline silicon is deposited overlying the STI and the semiconductor layer and is patterned to form a polycrystalline silicon mask comprising at least a first mask region and a second mask region. First and second openings are etched through the STI and the insulator using the mask as an etch mask. N- and P-type ions are implanted into the diode region through the openings to form the anode and cathode of the diode. The anode and cathode are closely spaced and precisely aligned to each other by the polycrystalline silicon mask. Electrical contacts are made to the anode and cathode.

20 Claims, 10 Drawing Sheets

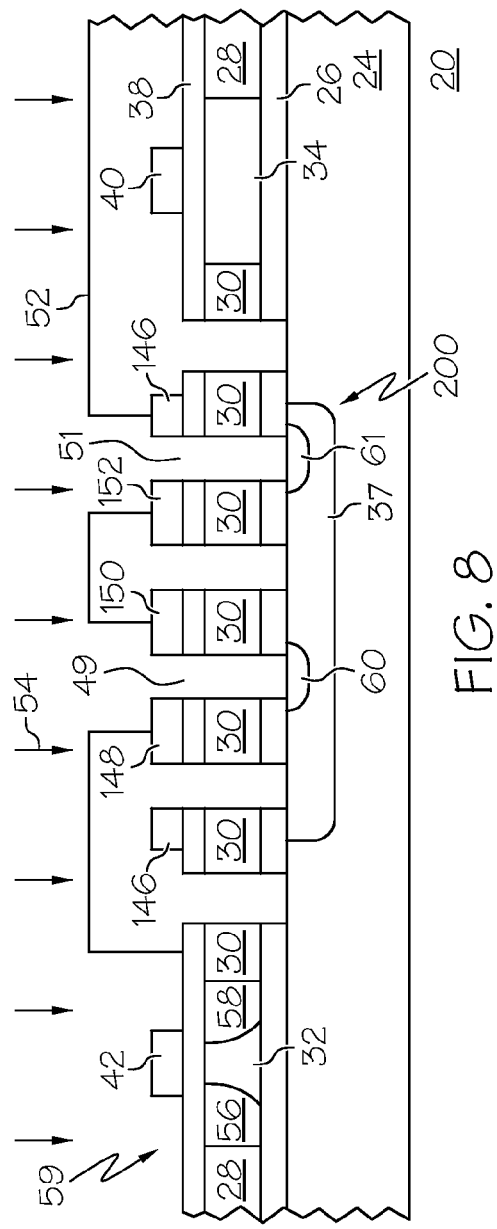
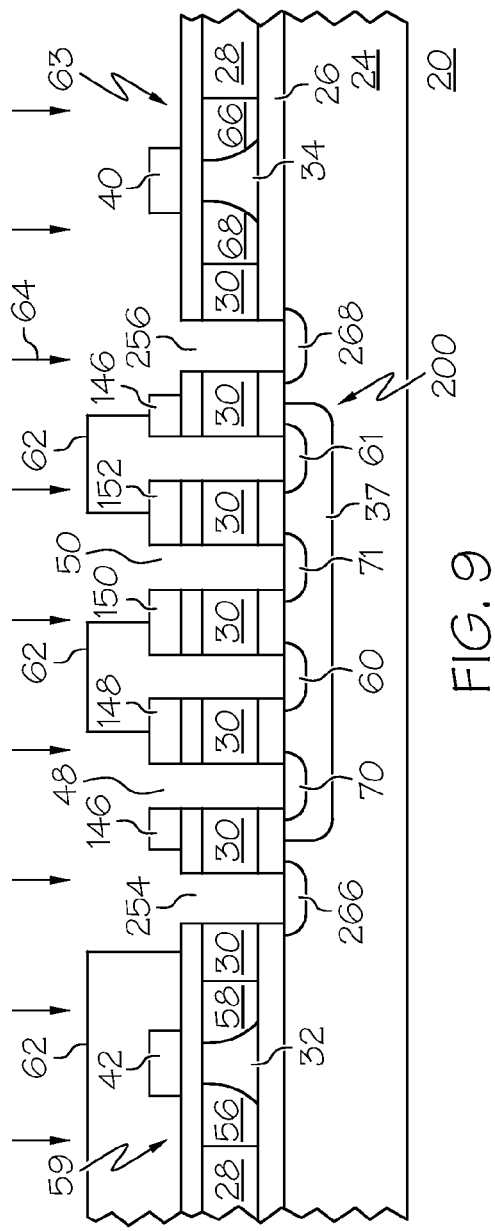
FIG. 8
FIG. 9

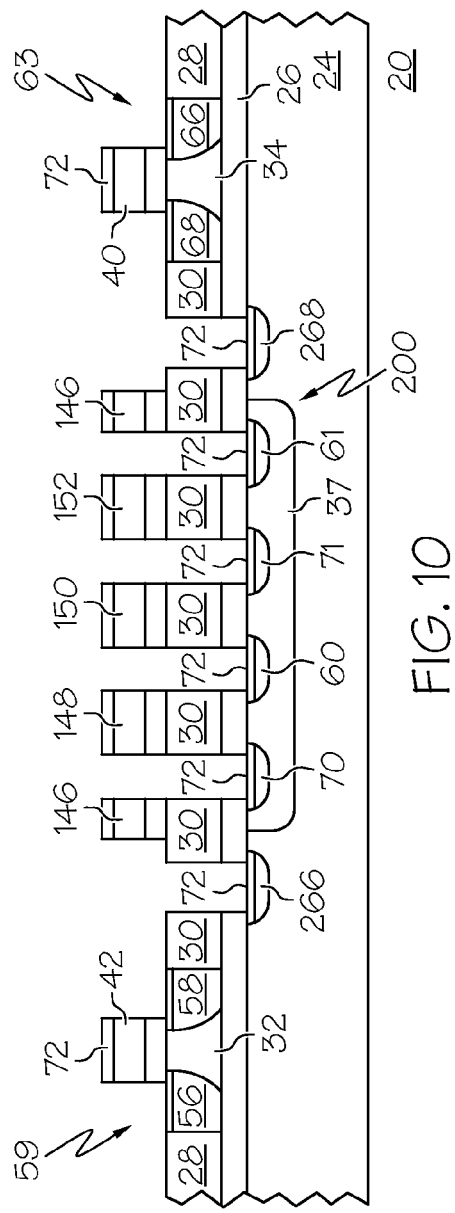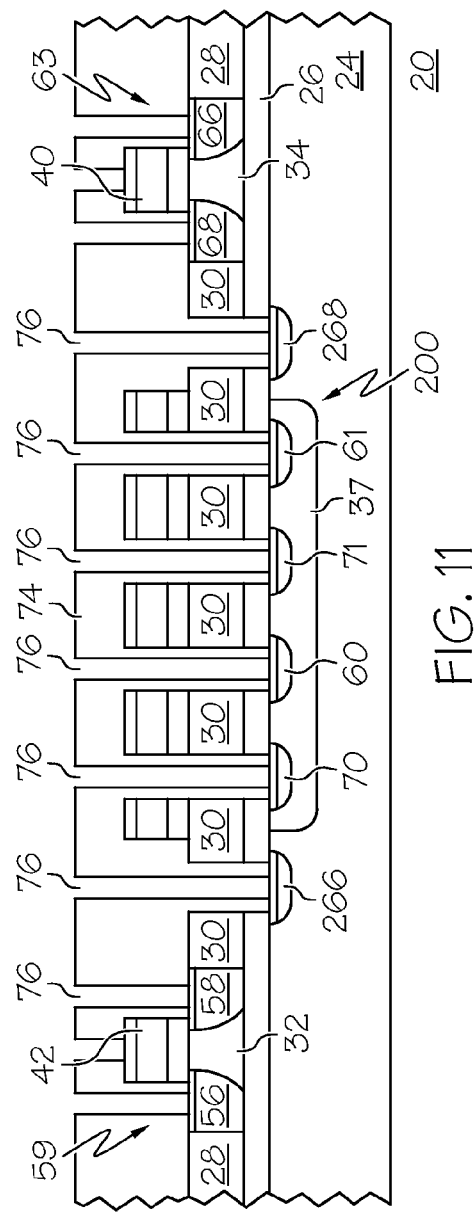

METHODS FOR FABRICATING A SEMICONDUCTOR DEVICE ON AN SOI SUBSTRATE

TECHNICAL FIELD

The present invention generally relates to methods for fabricating semiconductor devices, and more particularly relates to methods for fabricating SOI semiconductor devices including a diode formed in the supporting substrate.

BACKGROUND

The majority of present day integrated circuits (ICs) are implemented by using a plurality of interconnected field effect transistors (FETs), also called metal oxide semiconductor field effect transistors (MOSFETs or MOS transistors). The ICs are usually formed using both P-channel and N-channel FETs and the IC is then referred to as a complementary MOS or CMOS circuit. Certain improvements in the performance of FET ICs can be realized by forming the FETs in a thin layer of semiconductor material overlying an insulator layer. Such semiconductor on insulator (SOI) FETs, for example, exhibit lower junction capacitance and hence can operate at higher speeds. It is advantageous in certain applications, however, to fabricate at least some devices in the semiconductor substrate that supports the insulator layer. The devices formed in the substrate, for example, may have better thermal properties and can support higher voltages than devices formed in the thin semiconductor layer. Such devices can be used, for example, for band gap references and for thermal sensing.

As the complexity of the integrated circuits increases, more and more MOS transistors are needed to implement the integrated circuit function. As more and more transistors are designed into the IC, it becomes important to shrink the size of individual MOS transistors so that the size of the IC remains reasonable and the IC can be reliably manufactured. Shrinking the size of an MOS transistor implies that the minimum feature size, that is, the minimum width of a line or the minimum spacing between lines, is reduced. MOS transistors have now been aggressively reduced to the point at which the gate electrode of the transistor is less than or equal to 45 nanometers (nm) in width. Methods previously used to fabricate devices in the substrate of an SOI structure, however, have not be able to achieve the same minimum feature size in substrate devices as are realized in the devices formed in the thin semiconductor layer.

Accordingly, it is desirable to provide a method for fabricating SOI devices having small feature sizes. In addition, it is desirable to provide a self aligned method for fabricating small feature size substrate devices in an SOI device. Furthermore, other desirable features and characteristics of the present invention will become apparent from the subsequent detailed description and the appended claims, taken in conjunction with the accompanying drawings and the foregoing technical field and background.

BRIEF SUMMARY

Methods are provided for fabricating an SOI component on a semiconductor layer/insulator/substrate structure including a diode region formed in the substrate. The method comprises, in accordance with one embodiment, forming a shallow trench isolation (STI) region extending through the semiconductor layer to the insulator. A layer of polycrystalline silicon is deposited overlying the STI and the semiconductor layer and is patterned to form a polycrystalline silicon mask comprising at least a first mask region and a second mask region. First and second openings are etched through the STI and the insulator using the mask as an etch mask. N- and P-type ions are implanted into the diode region through the openings to form the anode and cathode of the diode. The anode and cathode are closely spaced and precisely aligned to each other by the polycrystalline silicon mask. Electrical contacts are made to the anode and cathode.

BRIEF DESCRIPTION OF THE DRAWINGS

The present invention will hereinafter be described in conjunction with the following drawing figures, wherein like numerals denote like elements, and wherein FIGS. 1-5 and 7-12 schematically illustrate, in cross section, method steps for fabricating a semiconductor device in accordance with an embodiment of the invention.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

FIGS. 1-12 schematically illustrate method steps for the manufacture of a CMOS integrated circuit 20 in accordance with various embodiments of the invention. Although the term "MOS device" properly refers to a device having a metal gate electrode and an oxide gate insulator, that term will be used herein to refer to any semiconductor device that includes a conductive gate electrode (whether metal or other conductive material) that is positioned over a gate insulator (whether oxide or other insulator) which, in turn, is positioned over a semiconductor substrate. In these illustrative embodiments only a small portion of CMOS integrated circuit 20 is illustrated. Various steps in the manufacture of CMOS devices are well known and so, in the interest of brevity, many conventional steps will only be mentioned briefly herein or will be omitted entirely without providing the well known process details. Although in this illustrative embodiment integrated circuit 20 is a CMOS circuit, the invention is also applicable to the fabrication of a single channel type MOS circuit.

Figure 1:
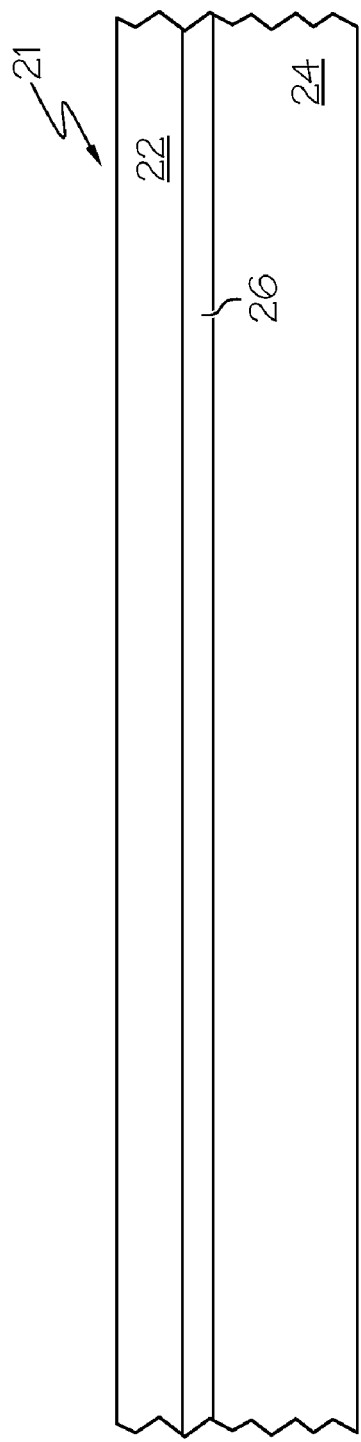

As illustrated in FIG. 1, the method in accordance with one embodiment of the invention begins with providing a semiconductor substrate 21. The semiconductor substrate is preferably a silicon substrate with a monocrystalline silicon layer 22 formed overlying a monocrystalline silicon carrier substrate 24. As used herein, the terms "silicon layer" and "silicon substrate" will be used to encompass the relatively pure monocrystalline silicon materials typically used in the semiconductor industry as well as silicon admixed with other elements such as germanium, carbon, and the like to form substantially monocrystalline semiconductor material. Monocrystalline silicon layer 22 will be used in the formation of N-channel and P-channel MOS transistors. Monocrystalline silicon substrate 24 will be used for the formation of a substrate PN junction diode. Monocrystalline silicon layer 22 can be formed, for example, by the well known layer transfer technique. In that technique hydrogen is implanted into a subsurface region of an oxidized monocrystalline silicon wafer. The implanted wafer is then flip bonded to monocrystalline silicon substrate 24. A two phase heat treatment is then carried out to split the hydrogen implanted wafer along the implanted region and to strengthen the bonding, leaving a thin monocrystalline silicon layer 22 bonded to the monocrystalline silicon substrate and separated from the substrate by a dielectric insulating layer 26. The monocrystalline silicon layer is then thinned and polished, for example by chemical mechanical planarization (CMP) techniques, to a thickness of about 50-300 nanometers (nm) depending on the circuit function being implemented. Both the monocrystalline silicon layer and the monocrystalline silicon carrier substrate preferably have a resistivity of at least about 1-35 Ohms per square. The silicon layer can be impurity doped either N-type or P-type, but is preferably doped P-type. Silicon substrate 24 is preferably impurity doped P-type. Dielectric insulating layer 26, typically silicon dioxide, preferably has a thickness of about 50-200 nm.

As one alternative to the wafer bonding technique, monocrystalline semiconductor substrate 21 can be formed by the SIMOX process. The SIMOX process is a well known process in which oxygen ions are implanted into a sub-surface region of monocrystalline silicon substrate 24. The monocrystalline silicon substrate and the implanted oxygen are subsequently heated to form a sub-surface silicon oxide dielectric layer 26 that electrically isolates SOI layer 22 from the remaining portion of monocrystalline silicon substrate 24. The thickness of SOI layer 22 is determined by the energy of the implanted ions. Dielectric layer 26 is commonly referred to as a buried oxide or "BOX" and will so be referred to herein.

Figure 2:
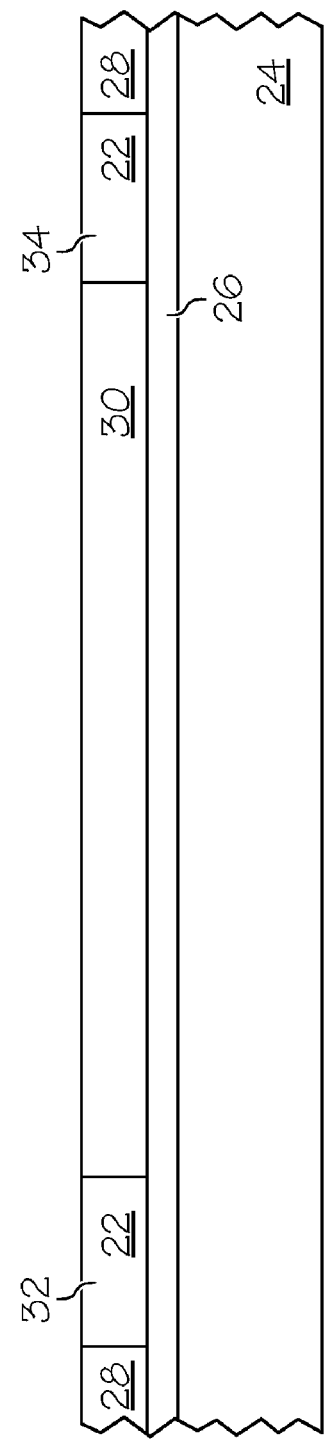

Having provided a semiconductor substrate 21, the method in accordance with one embodiment of the invention continues as illustrated in FIG. 2 by the formation of dielectric isolation regions 28, 30 extending through monocrystalline silicon layer 22 to dielectric layer or BOX 26. The dielectric isolation regions are preferably formed by the well known shallow trench isolation (STI) technique in which trenches are etched into monocrystalline silicon layer 22, the trenches are filled with a dielectric material such as a deposited silicon oxide, and the excess silicon oxide is removed by CMP. STI regions 28 provide electrical isolation, as needed for the circuit function being implemented, between various devices of the CMOS circuit that are to be formed in monocrystalline silicon layer 22. In accordance with an embodiment of the invention, STI region 30 aids in electrically isolating a PN junction diode to be formed in carrier substrate 24 from the devices to be formed in monocrystalline silicon layer 22. Either before or after the formation of dielectric isolation regions 28, 30, portions of monocrystalline silicon layer 22 can be doped, for example by ion implantation, to form P-type regions 32 and N-type regions 34.

Figure 3:
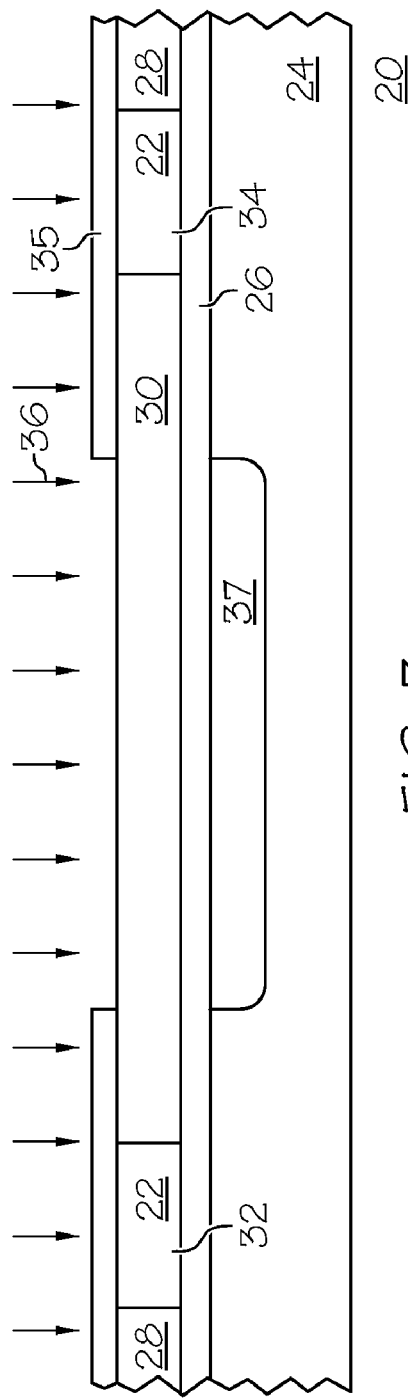

In accordance with one embodiment of the invention, a layer 35 of photoresist is applied overlying the surface of monocrystalline silicon layer 22 and dielectric isolation regions 28, 30. The layer of photoresist is patterned to expose a portion of dielectric isolation region 30 as illustrated in FIG. 3. The patterned photoresist is used as an ion implantation mask and conductivity determining ionic impurities are implanted, as indicated by arrows 36, into the surface of monocrystalline silicon substrate 24 to form a doped region 37. For example, phosphorus ions can be implanted into the monocrystalline silicon substrate at an energy of about 200-300 KeV and dose of about $1\times10^{13}$-$2\times10^{14}$ cm$^{-2}$ to form an N-type doped region 37.

Figure 4:
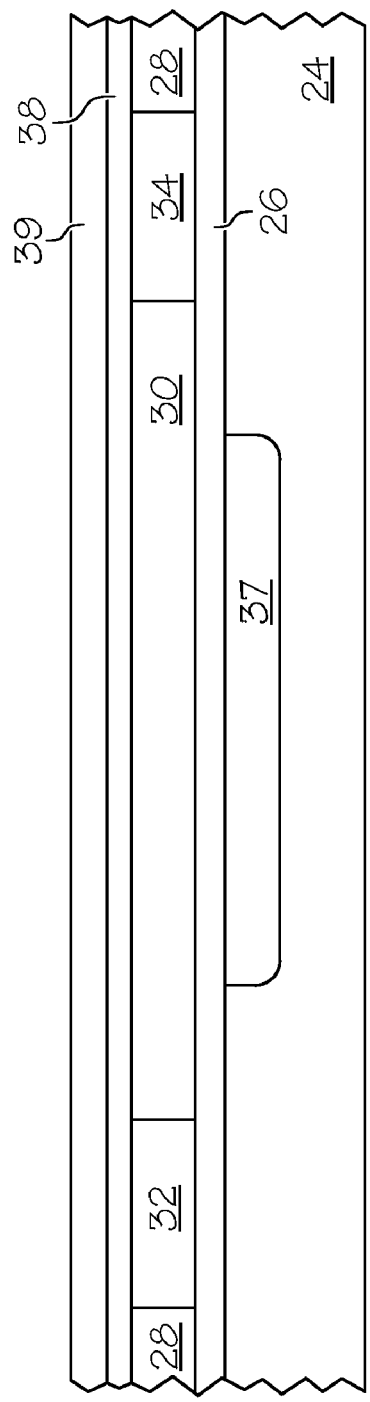

As illustrated in FIG. 4, after removing layer 35 of photoresist, a layer of gate insulator material 38 is grown or deposited on the surface of silicon layer 22. The gate insulator may be a thermally grown silicon dioxide formed by heating the silicon substrate in an oxidizing ambient, or may be a deposited insulator such as a silicon oxide, silicon oxynitride, silicon nitride, a high dielectric constant insulator such as HfSiO, or the like. Deposited insulators can be deposited, for example, by chemical vapor deposition (CVD), low pressure chemical vapor deposition (LPCVD), or plasma enhanced chemical vapor deposition (PECVD). The gate insulator material is typically 1-10 nanometers (nm) in thickness. As illustrated, gate insulator material 38 is a deposited layer that is deposited onto both the dielectric isolation regions 28, 30 and the remaining monocrystalline silicon layer 22. As is well known, a grown thermal oxide would be grown only on the monocrystalline silicon layer. A layer 39 of gate electrode forming material such as polycrystalline silicon is deposited overlying gate insulator material 38, monocrystalline silicon layer 22, and the dielectric isolation regions 28, 30. Layer 39 will hereinafter be referred to, for ease of discussion but without limitation, as a polycrystalline silicon layer although those of skill in the art will recognize that other conductive materials could be used as the gate electrode material. The layer of polycrystalline silicon is preferably deposited as undoped polycrystalline silicon and is subsequently impurity doped by ion implantation. Polycrystalline silicon can be deposited, for example, by the reduction of silane ($SiH_4$) in an LPCVD reaction.

Figure 5:
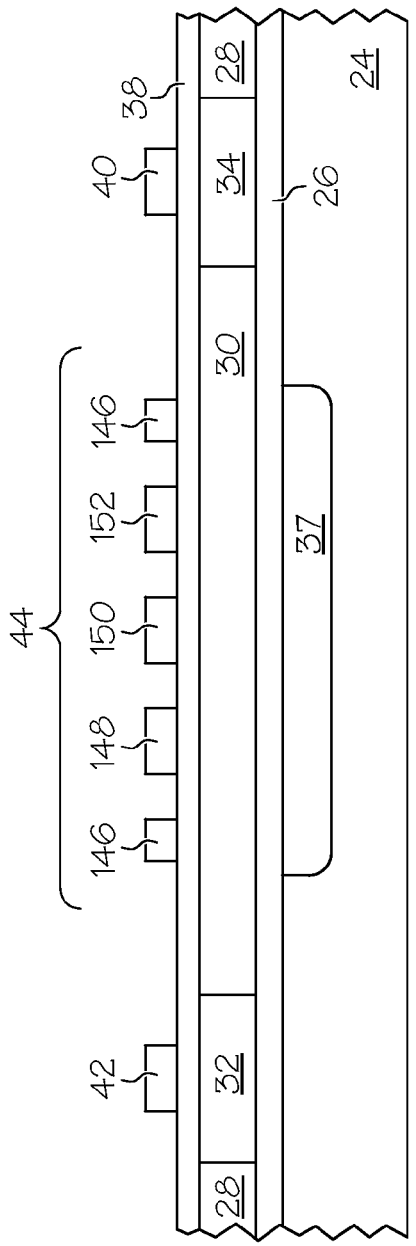
Figure 6:
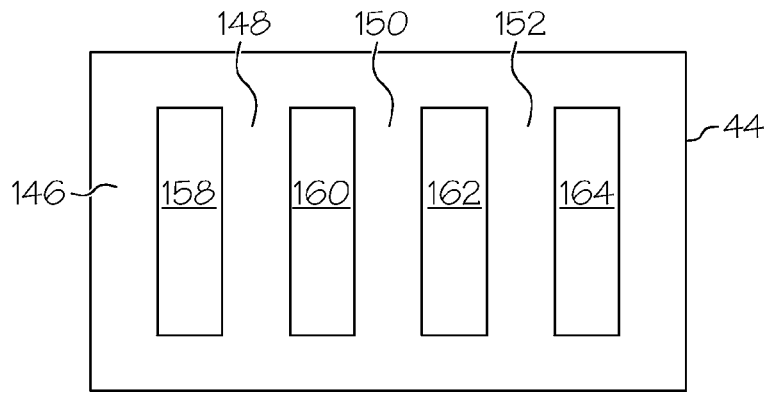
FIGS. 6, 14, and 20 schematically illustrate, in plan view, masks for use in the various embodiments of the invention.

The method in accordance with an embodiment of the invention proceeds as illustrated in FIG. 5. Polycrystalline silicon gate electrode layer 39 is patterned and etched to form a P-channel gate electrode 40 overlying N-type region 34 of monocrystalline silicon layer 22, an N-channel gate electrode 42 overlying P-type region 32 of monocrystalline silicon layer 22 and a polycrystalline silicon mask 44 overlying dielectric isolation region 30. The etching of polycrystalline gate electrodes is well advanced in the art so that gate lengths of only 45 nm or less can be achieved. Polycrystalline silicon gate electrode layer 39 is preferably etched using well know and advanced patterning and etching techniques to preferably obtain gate electrodes 40 and 42 and portions of mask 44, each having minimum feature size. Such advanced patterning and etching techniques generally involve patterning and etching the polycrystalline silicon using the minimum available photolithography exposure feature size followed by isotropically etching the polycrystalline silicon to further reduce the width of the resulting structure. FIG. 6 illustrates, in plan view, polycrystalline silicon mask 44 in accordance with one embodiment of the invention. In accordance with this embodiment of the invention, mask 44 includes a surrounding ring or frame structure 146 and at least one divider and preferably a plurality of dividers 148, 150, 152. Dividers 148, 150, 152 preferably each have the minimum feature size. The surrounding ring structure is illustrated to be generally a rectangular frame mask, although those of skill in the art will understand that the ring structure can have any desired shape. Dividers 148, 150, and 152 together with surrounding ring structure 146 define a plurality of mask regions 158, 160, 162, and 164. Although only three dividers and four mask regions have been illustrated, those of skill in the art will understand that the number of dividers and mask regions can be increased as required to implement the desired circuit function.

Figure 7:
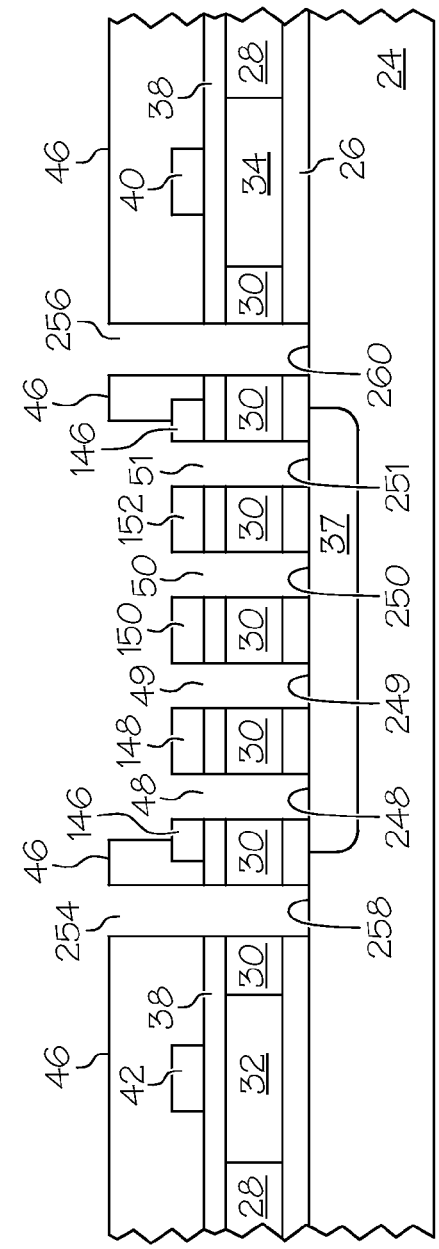

As illustrated in FIG. 7, a layer 46 of photoresist is applied to the structure and is patterned to expose a portion of dielectric isolation region 30 (or gate insulator layer 38 overlying dielectric isolation region 30) and polycrystalline silicon mask 44. In accordance with an embodiment of the invention, the patterned layer of photoresist and polycrystalline silicon mask 44 are used together as an etch mask to etch openings 48, 49, 50, and 51 through dielectric isolation region 30 and dielectric insulating layer 26 and to expose portions 248, 249, 250, and 251, respectively, of impurity doped region 37. Openings 48, 49, 50, and 51 are anisotropically etched through dielectric isolation region 30 and dielectric insulating layer 26, preferably by reactive ion etching. The dielectric layers can be reactive ion etched, for example, using a $CF_4$ or $CHF_3$ chemistry. The spacing between openings 48, 49, 50, and 51 as well as the total area of the diode structure are determined, not by the spacing of openings in layer 46 of photoresist, but by the width of dividers 148, 150, 152 and the overall size of polycrystalline silicon mask 44 and hence, in accordance with an embodiment of the invention, are self aligned and are comparable to the minimum feature size. The spacing between the openings can thus be less than the minimum photolithographic feature spacing otherwise attainable through photolithographic patterning and etching alone. As also illustrated in FIG. 7, in accordance with a further embodiment of the invention, openings 254 and 256 can also be etched through STI layer 30 and insulator layer 26 to expose portions 258 and 260 of silicon substrate 24 adjacent to but spaced apart from impurity doped region 37. Openings 254 and 256 can be patterned and etched using standard photolithography techniques by etching through openings in photoresist layer 46.

After removing layer 46 of photoresist another layer 52 of photoresist can next be applied to the structure and patterned to expose openings 49 and 51 while masking openings 48, 50, 254, and 256. The photoresist layer is also patterned to expose regions 32 while masking region 34 as illustrated in FIG. 8. Patterned photoresist layer 52 is used as an ion implantation mask and N-type impurity dopant ions, preferably arsenic ions, are implanted into the exposed areas as indicated by arrows 54. The N-type impurity dopant ions form source 56 and drain 58 regions of an N-channel MOS transistor 59 that are self aligned with gate electrode 42 and cathode regions 60 and 61 of a substrate diode 200 self aligned with the edges of dividers 148, 150, 152 and surrounding ring 146 of polycrystalline silicon mask 44.

Layer 52 of photoresist is removed and another layer 62 of photoresist is applied to the structure and is patterned to expose openings 48 and 50 and region 34 while masking the previously exposed openings and region as illustrated in FIG. 9. Patterned photoresist layer 62 is used as an ion implantation mask and P-type impurity dopant ions, preferably boron ions, are implanted into the exposed areas as indicated by arrows 64. The P-type impurity dopant ions form source 66 and drain 68 regions of a P-channel MOS transistor 63 that are self aligned with gate electrode 40 and anode regions 70 and 71 of diode 200 that are self aligned with the edge of surrounding ring 146 of polycrystalline silicon mask 44 and the edges of dividers 148, 150, and 152. In accordance with one embodiment of the invention the P-type impurity dopant ions are also implanted through openings 254 and 256 to form guard bands or contact areas 266 and 268 in silicon substrate 24. Photoresist layer 52 is removed and both the N-type and P-type ion implanted regions are heated, preferably by rapid thermal annealing, to activate the implanted ions. Other conventional method steps (not illustrated) such as the formation of sidewall spacers on the gate electrodes, implantation of additional source and drain regions, removal of gate insulator material that is not disposed under a gate electrode, and the like, may now be carried out to complete the processing of the MOS transistors.

In accordance with an embodiment of the invention a layer of silicide forming metal such as nickel, cobalt, titanium, palladium, or the like is deposited onto the structure and in contact with the ion implanted source, drain, anode and cathode regions, guard bands 266 and 268, as well as to gate electrodes 40 and 42. The silicide forming metal preferably has a thickness of about 5-15 nm. The silicide forming metal is heated, preferably to a temperature of about 350°-500° C., to cause the metal to react with the silicon with which it is in contact to form a metal silicide contact region 72 at the surface of each of the ion implanted regions and on the gate electrodes as illustrated in FIG. 10. Silicide also forms on the surface of polycrystalline silicon mask 44. The metal that is not in contact with silicon, for example the metal that is deposited on the dielectric isolation regions, does not react to form a silicide during the heating step and can be removed, for example by wet etching in a $H_2O_2/H_2SO_4$ or $HNO_3/HCl$ solution.

As illustrated in FIG. 11 a layer 74 of insulating material is deposited and planarized to cover the metal silicide contact regions. The insulating material can be deposited, for example, by low pressure chemical vapor deposition using a tetraethylorthosilicate (TEOS) source. Layer 74 is preferably planarized by CMP. Following the planarization, a layer of photoresist (not illustrated) is applied to the surface of the planarized insulating material and is patterned for use as an etch mask to etch contact openings 76 that extend through the insulating material to the metal silicide contact regions of transistor 59, transistor 63, the anode and cathode regions of diode 200, and guard bands 266 and 268. Openings 76 can also be made to extend to the gate electrodes of selected MOS transistors of device 20 as needed to implement the intended circuit function.

Figure 12:
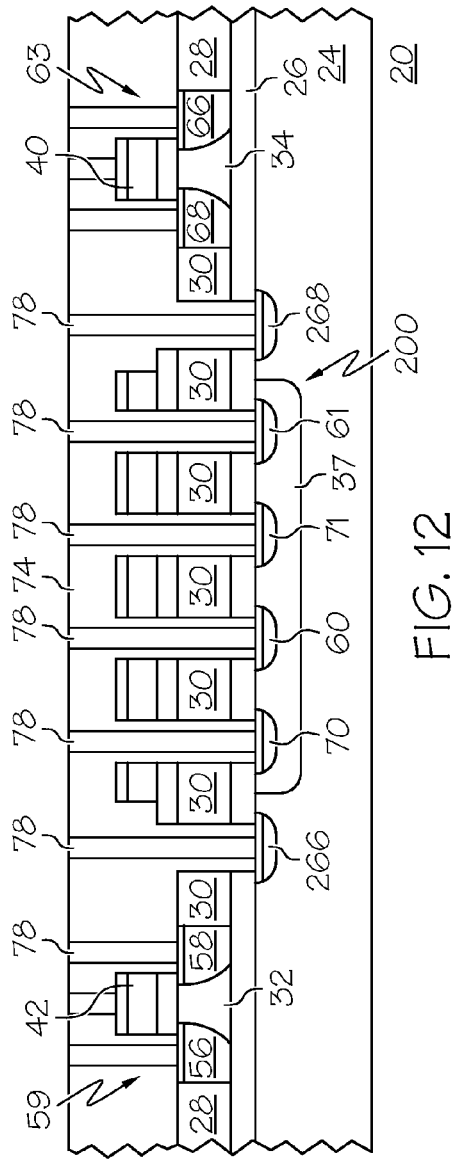

Contact plugs 78 are formed in each of contact openings 76 to allow electrical contact to the various device regions. The contact plugs can be formed, for example, by depositing successive layers of titanium, titanium nitride, and tungsten in known manner. The excess titanium, titanium nitride and tungsten layers can then be removed by CMP to leave contact plugs 78 as illustrated in FIG. 12. Those of skill in the art will understand that contact openings 76 and contact plugs 78 may not be needed to contact each and every one of the silicide contact regions at this stage of the device processing, but rather that such contacting will be dictated by the details of the circuit being implemented.

Those of skill in the art also will appreciate that alternative and/or additional steps may be used to fabricate integrated circuit 20 and the order of the method steps may be changed without departing from the broad scope of the invention. For example, sidewall spacers may be formed at the edges of the gate electrodes and those spacers may be used as masks for additional ion implantations or to space the metal silicide contacts apart from the gate electrodes. The order of the P-type and N-type ion implantations may also be changed.

Figure 14:
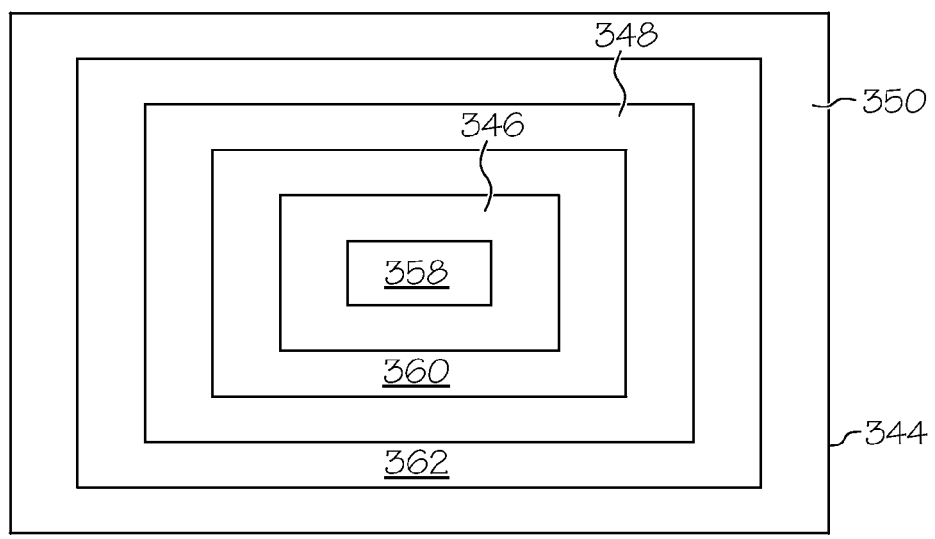
Figure 20:
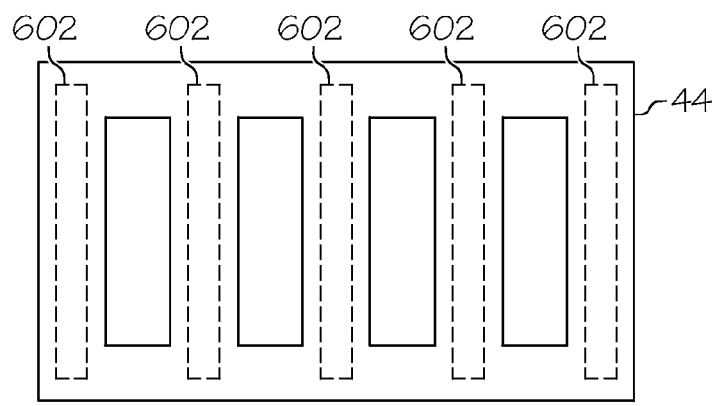
Figure 13:
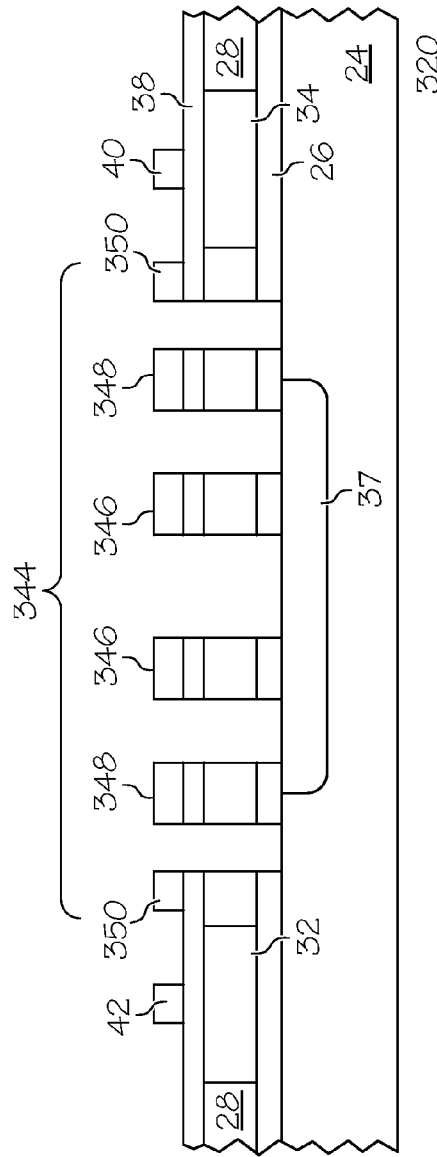
FIGS. 13 and 15-17 schematically illustrate, in cross section, method steps for fabricating a semiconductor device in accordance with a further embodiment of the invention.

In accordance with a further embodiment of the invention the initial steps in a method for fabricating a CMOS integrated circuit 320 are the same as those described and illustrate above with reference to FIGS. 1-4. The method in accordance with this further embodiment proceeds as illustrated in cross section in FIG. 13. Polycrystalline silicon gate electrode layer 39 is patterned and etched to form a P-channel gate electrode 40 overlying N-type region 34 of monocrystalline silicon layer 22, an N-channel gate electrode 42 overlying P-type region 32 of monocrystalline silicon layer 22 and a polycrystalline silicon mask 344 overlying dielectric isolation region 30. The polycrystalline silicon gate electrode layer can be patterned and etched, for example, in the same manner as described above to preferably obtain gate electrodes 40 and 42 and portions of mask 344 each having minimum feature size. FIG. 14 illustrates, in plan view, polycrystalline silicon mask 344 in accordance with one embodiment of the invention. In accordance with this embodiment of the invention, mask 344 includes concentric rings 346, 348, and 350. At least rings 346 and 348 preferably each have the minimum feature size. The concentric rings are illustrated to be generally rectangular, although those of skill in the art will understand that the rings can have any desired shape. Concentric rings 346, 348, and 350 define a plurality of mask regions 358, 360, and 362. Mask region 358 is defined by the interior of ring 346, mask region 360 is defined by the space between ring 346 and ring 348, and mask region 362 is defined by the space between ring 348 and ring 350.

Figure 15:
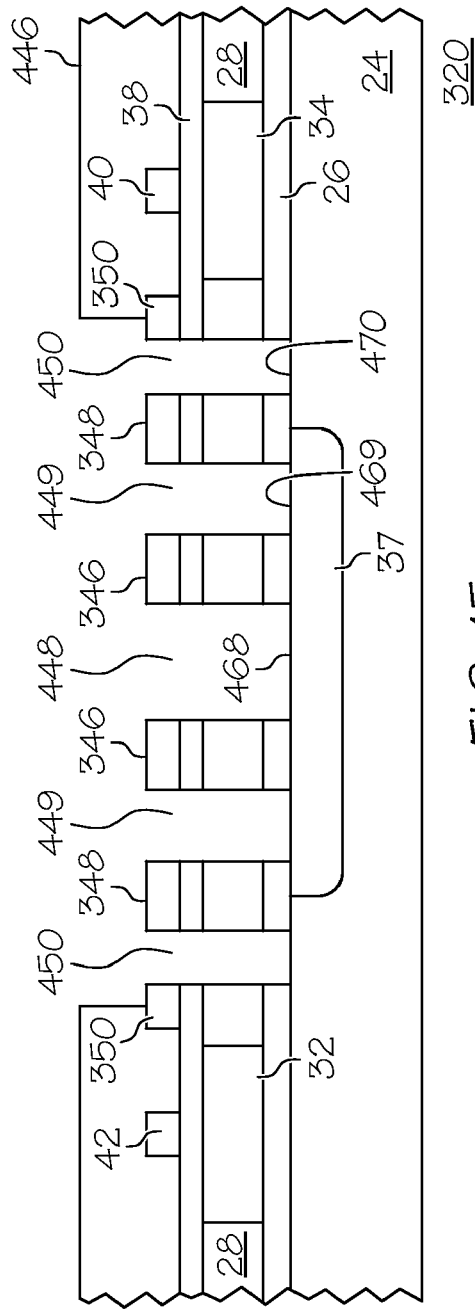

As illustrated in cross section in FIG. 15, a layer of photoresist 446 is patterned and developed to expose a portion of dielectric isolation region 30 (or gate insulator 38 overlying dielectric isolation region 30) and polycrystalline silicon mask 344. In accordance with an embodiment of the invention, the patterned layer of photoresist and polycrystalline silicon mask 344 are used together as an etch mask to etch openings 448, 449, and 450 through dielectric isolation region 30 and dielectric insulating layer 26 and to expose portions 468 and 469 of impurity doped region 37 and portion 470 of substrate 24 spaced apart from but adjacent to impurity doped region 37. As in the earlier embodiment, openings 448, 449 and 450 are anisotropically etched through dielectric isolation region 30 and dielectric insulating layer 26, preferably by reactive ion etching. The spacing between openings 448, 449, and 450 as well as the total area of the diode structure are determined, not by the spacing of openings in layer 446 of photoresist, but by the width of dividers 346 and 348 and the overall size of polycrystalline silicon mask 344 and hence, in accordance with an embodiment of the invention, are self aligned and are comparable to the minimum feature size. Opening 448 is determined by mask region 358, opening 449 is determined by mask region 360, and opening 450 is determined by mask opening 362.

Figure 16:
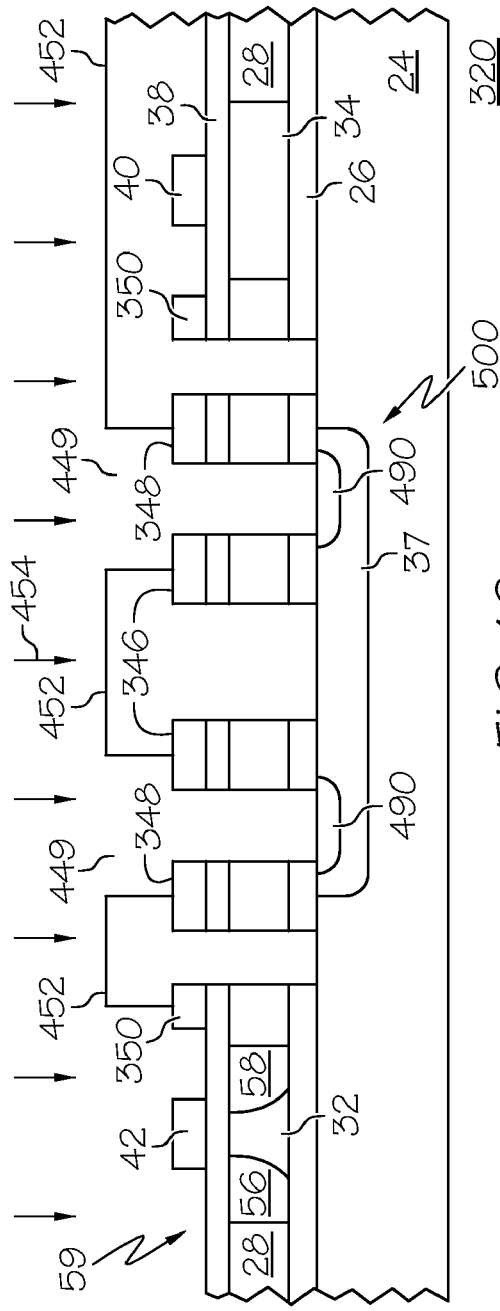

The method continues, in accordance with an embodiment of the invention, by removing patterned photoresist layer 446 and by applying and patterning a photoresist layer 452 to expose opening 449 while masking openings 448 and 450. Patterned photoresist layer 452 also exposes region 32 while masking region 34 as illustrated in FIG. 16. Patterned photoresist layer 452 is used together with polycrystalline silicon mask 344 as an ion implantation mask and N-type impurity dopant ions, preferably arsenic ions, are implanted into the exposed areas as indicated by arrows 454. The N-type impurity dopant ions form source 56 and drain 58 regions of an N-channel MOS transistor 59 that are self aligned with gate electrode 42 and cathode region 490 of a substrate diode 500. The extent of cathode region 490 is determined by the spacing between portions 346 and 348 of polycrystalline silicon mask 344.

Figure 17:
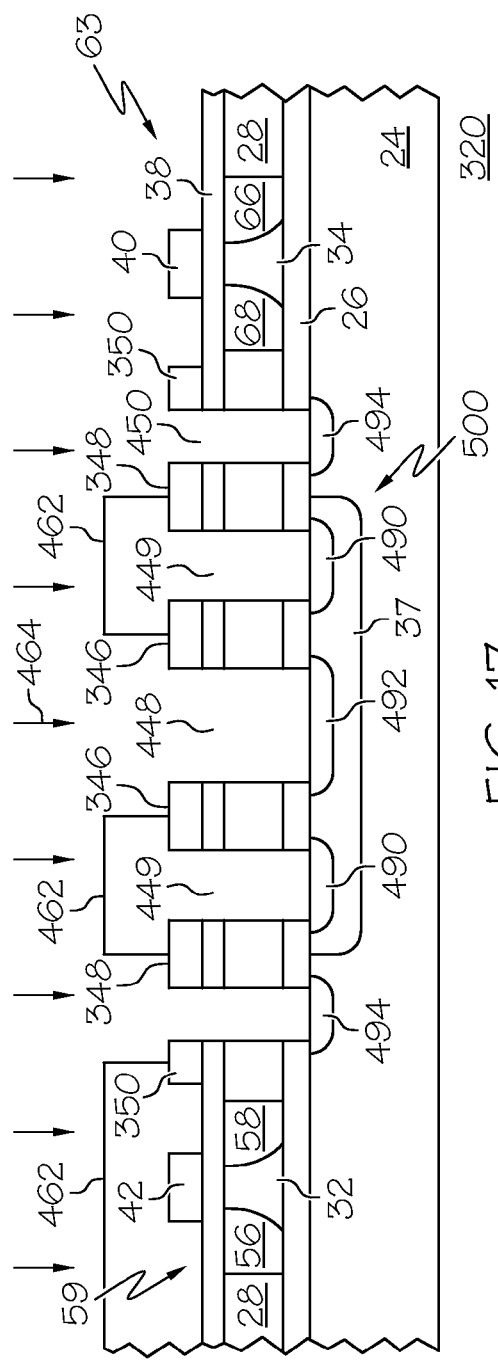

After removing patterned photoresist layer 452, the method for fabricating substrate diode 500 continues as illustrated in FIG. 17 by the application and patterning of an additional photoresist layer 462. Photoresist layer 462 is patterned to expose region 34 while masking region 32 and to expose openings 448 and 450 while masking opening 449. Patterned photoresist layer 462 is used together with polycrystalline silicon mask 344 as an ion implantation mask and P-type impurity dopant ions, preferably boron ions, are implanted into the exposed areas as indicated by arrows 464. The P-type impurity dopant ions form source 66 and drain 68 regions of a P-channel MOS transistor 63 that are self aligned with gate electrode 40 and anode region 492 and guard band 494 of substrate diode 500. The extent of anode region 492 is determined by mask region 358 of polycrystalline silicon mask 344. The anode, cathode, and guard band are self aligned by polycrystalline silicon mask 344. Although not illustrated, integrated circuit device 320 can be completed in the same manner as IC device 20, for example, by forming metal silicide regions, forming conductive plugs, and the like.

A further embodiment of the invention is illustrated in FIGS. 18-21 for fabricating a CMOS integrated circuit 590. This embodiment of the invention is applicable to any of the previously described embodiments, but will be illustrated as it applies to the embodiments illustrated in FIGS. 1-12. Method steps that are the same or similar to the method steps illustrated in those figures will not be repeated in detail, but will only be referred to briefly.

Figure 18:
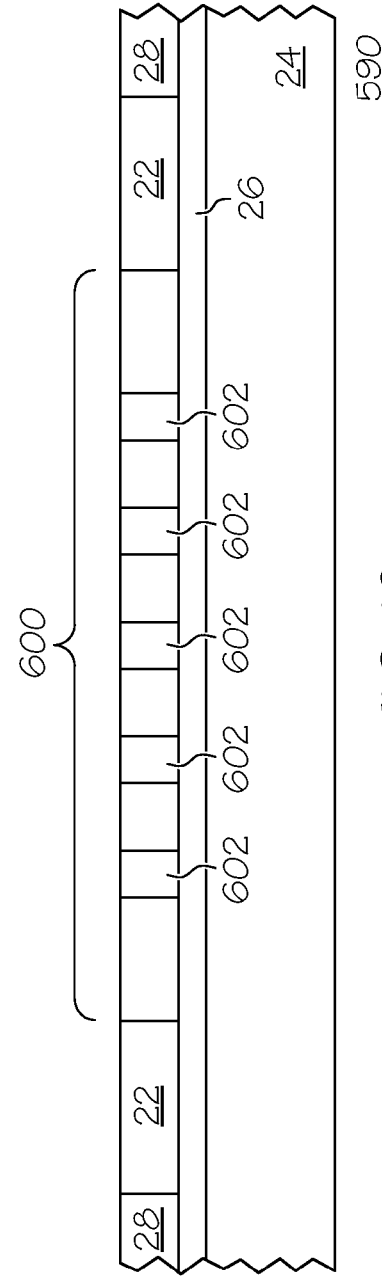
FIGS. 18, 19, and 21 schematically illustrate, in cross section, method steps for fabricating a semiconductor device in accordance with yet another embodiment of the invention.

It is known that when layers of material are planarized by chemical mechanical planarization (CMP) large open areas polish differently than areas that are characterized by a dense pattern of features. Those large open areas are subject to "dishing". That is, instead of achieving a planar surface, CMP of the large open areas results in a slightly concave surface with the layer thinner at the middle of the area than at the edges. Such a dishing problem can be experienced by the CMP of large STI areas such as STI 30 although, for example in FIG. 2, the surface of STI 30 has been illustrated as a planar surface. In accordance with this embodiment of the invention, after providing the starting semiconductor substrate as illustrated in FIG. 1, dielectric isolation regions 28 and 600 are formed that extend through monocrystalline silicon layer 22 to dielectric layer 26 as illustrated in FIG. 18. Again, the dielectric isolation regions are preferably formed by well known STI techniques, but in contrast to STI region 30 formed previously, dielectric isolation region 600 is not continuous, but instead is interrupted by a plurality of retained regions 602 of monocrystalline silicon layer 22. The location of these retained regions will become more apparent below. By including the retained regions of monocrystalline silicon layer 22 the dishing of STI region 600 is avoided because the region is now characterized by a pattern of dense features.

Figure 19:
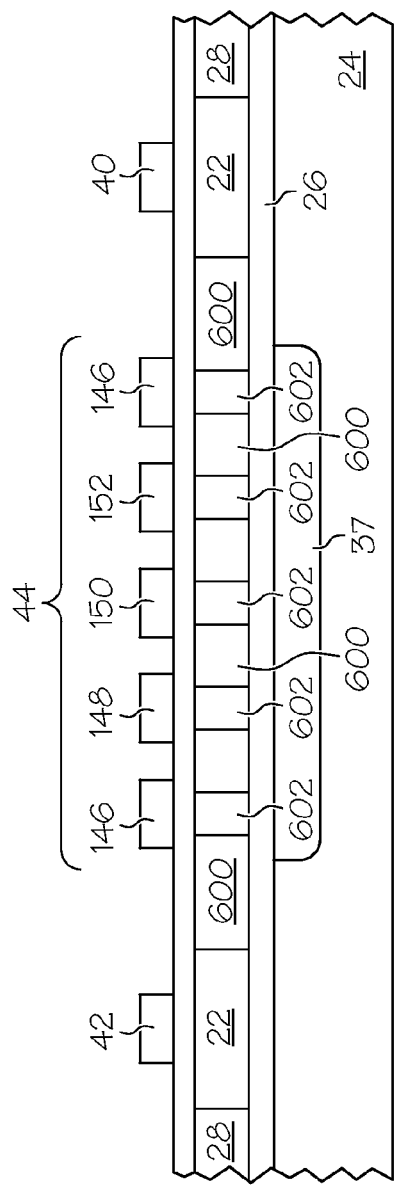

The method in accordance with this embodiment of the invention continues with steps similar to those illustrated in FIGS. 3-5. A diode region 37 is formed in substrate 24 by ion implantation, a layer of gate insulating material 38 is formed at the surface of thin monocrystalline silicon layer 22, and a layer of gate electrode forming material such as polycrystalline silicon is deposited overlying the layer of gate insulating material. As illustrated in FIG. 19, the layer of polycrystalline silicon is patterned to form gate electrodes 40 and 42 and a polycrystalline silicon mask 44. Portions of polycrystalline silicon mask 44 overlie retained regions 602 of monocrystalline silicon layer 22. The relationship between portions 146, 148, 150, and 152 of polycrystalline silicon mask 44 and retained regions 602 of monocrystalline silicon layer 22 is further illustrated in FIG. 20 which illustrates mask 44 in plan view and upon which the location of retained regions 602 (shown in dashed lines) has been superimposed.

Figure 21:
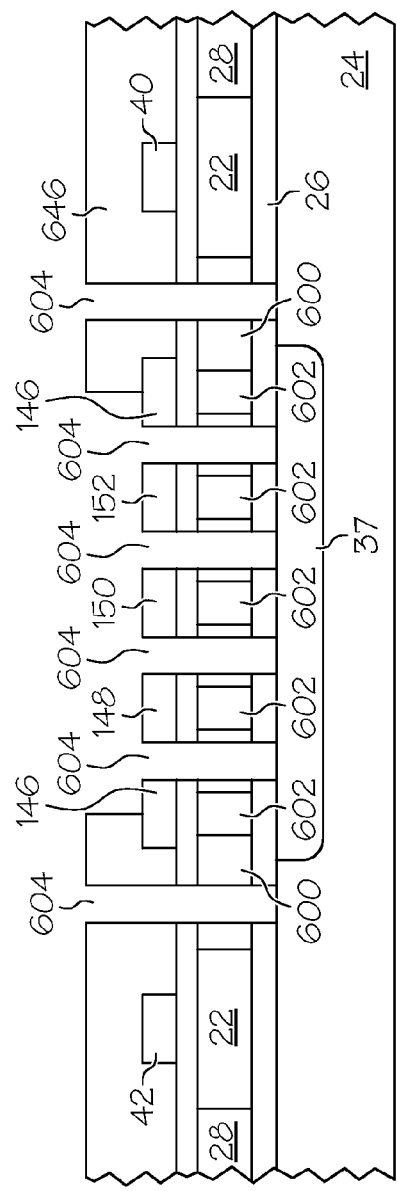

The method in accordance with this embodiment of the invention proceeds in the same manner as previously illustrated in FIGS. 7-12. Retained regions 602 are "active dummy regions"; they are formed from the active area, that is monocrystalline silicon layer 22, act to improve the planarization of the STI regions, but otherwise are not involved in the fabrication or operation of the semiconductor device. For example, as illustrated in FIG. 21, the method continues by etching openings 604 that extend through dielectric isolation region 600 and insulating layer 26 to expose portions of diode region 37 and substrate 24 using polycrystalline silicon mask 44 and patterned photoresist layer 646 as an etch mask. As can be seen from this figure, retained regions 602 are not involved in this method step.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for fabricating a semiconductor component including a semiconductor on insulator (SOI) substrate having a first semiconductor layer, a layer of insulator on the first semiconductor layer, and a second semiconductor layer overlying the layer of insulator, the method comprising the steps of:
   etching a first opening extending through the second semiconductor layer to expose a portion of the layer of insulator;
   filling the first opening with a dielectric material;
   implanting first type conductivity determining ions into the first semiconductor layer to form an impurity doped region of first conductivity type;
   depositing a layer of polycrystalline silicon overlying the dielectric material and the second semiconductor layer;
   patterning the layer of polycrystalline silicon to form a polycrystalline silicon mask comprising at least a first mask region and a second mask region;
   etching a second opening and a third opening, each of the second opening and the third opening extending through the dielectric material and the layer of insulator, the second opening defined by the first mask region and the third opening defined by the second mask region;
   implanting first type conductivity determining ions into the doped region of first conductivity type through the second opening to form a first region of additional impurity doping of first conductivity type in the doped region of first conductivity type;
   implanting second type conductivity determining ions into the doped region of first conductivity type through the third opening to form a second impurity doped region of second conductivity type in the doped region of first conductivity type; and
   forming a first electrical contact to the first region of additional impurity doping and a second electrical contact to the second impurity doped region.

2. The method of claim 1 wherein the step of patterning the layer of polycrystalline silicon comprises the step of etching the polycrystalline silicon to form a surrounding ring structure surrounding an area and at least one divider dividing the area into at least a first area defining the first mask region and a second area defining the second mask region.

3. The method of claim 2 further comprising the steps of:
   etching at least a fourth opening extending through the dielectric material and the layer of insulator adjacent one of the second opening and the third opening; and
   implanting second type conductivity determining ions into the first semiconductor layer adjacent the impurity doped region.

4. The method of claim 1 wherein the step of patterning the layer of polycrystalline silicon comprises the step of etching the polycrystalline silicon to form at least two concentric rings.

5. The method of claim 4 wherein the step of patterning the layer of polycrystalline silicon comprises the step of etching the polycrystalline silicon to form first, second, and third concentric rings wherein the first mask region comprises an area bounded by the first concentric ring, the second mask region comprises an area between the first and second concentric rings, and a third mask region comprises an area between the second and third concentric rings.

6. The method of claim 1 wherein the step of etching a first opening comprises the step of etching a first opening encircling at least one region of the second semiconductor layer that is not etched and wherein the step of patterning the layer of polycrystalline silicon comprises the step of patterning the layer of polycrystalline silicon to leave a portion of the polycrystalline silicon mask overlying the at least one region.

7. The method of claim 1 wherein the step of patterning the layer of polycrystalline silicon further comprises the step of patterning the layer of polycrystalline silicon to form a gate electrode of a field effect transistor.

8. A method for fabricating a semiconductor component including a semiconductor on insulator (SOI) substrate having a first semiconductor layer, a layer of insulator on the first semiconductor layer, and a second semiconductor layer overlying the layer of insulator, the method comprising the steps of:
   forming a shallow trench isolation region extending through the second semiconductor layer to the layer of insulator;
   forming a mask comprising polycrystalline silicon overlying the shallow trench isolation region, the mask comprising a first opening and a second opening;
   implanting first type conductivity determining ions into the first semiconductor layer through the first opening to form a first impurity doped region and second type conductivity determining ions into the first semiconductor layer through the second opening to form a second impurity doped region; and
   forming a first electrical contact to the first impurity doped region and a second electrical contact to the second impurity doped region.

9. The method of claim 8 wherein the step of forming a mask comprises the steps of:
   depositing a layer of polycrystalline silicon; and
   patterning and etching the layer of polycrystalline silicon to form a mask comprising a ring portion surrounding an area and at least one cross member extending across the area and with the ring portion forming the first opening and the second opening.

10. The method of claim 8 wherein the step of forming a mask comprises the steps of:
    depositing a layer of polycrystalline silicon; and
    patterning and etching the layer of polycrystalline silicon to form a mask comprising a plurality of concentric ring shaped portions defining the first opening within an inner one of the plurality of ring shaped portions and the second opening between the inner one and another of the plurality of ring shaped portions.

11. The method of claim 8 further comprising the step of implanting conductivity determining ions into the first semiconductor layer to form a diode region and wherein the step of implanting first type conductivity determining ions and second type conductivity determining ions comprises the step of implanting first type conductivity determining ions and second type conductivity determining ions into the diode region.

12. The method of claim 11 wherein the first semiconductor layer is of first conductivity type and the diode region is of second conductivity type, the method further comprising the step of implanting conductivity determining ions of first conductivity type into the first semiconductor layer adjacent the diode region to form a guard band.

13. The method of claim 8 wherein the step of forming a shallow trench isolation region comprises the steps of:
   etching an opening that extends through the second semiconductor layer and surrounds a portion of the second semiconductor layer that is not etched;
   filling the opening with dielectric material; and
   planarizing the dielectric material by chemical mechanical planarization.

14. A method for fabricating a semiconductor component including a silicon on insulator (SOI) substrate having a first p-type silicon layer, a layer of insulator on the first p-type silicon layer, and a second silicon layer overlying the layer of insulator, the method comprising the steps of:
   implanting n-type conductivity determining ions into the first p-type silicon layer to form a first n-type diode region;
   forming a dielectric isolation region extending through the second semiconductor layer to the layer of insulator;
   depositing a layer of polycrystalline silicon overlying the dielectric isolation region and the second semiconductor layer;
   patterning the layer of polycrystalline silicon to form a polycrystalline silicon mask comprising a first portion surrounding a first region and a second portion surrounding a second region, the first region and the second region each overlying the first n-type diode region;
   etching through the dielectric isolation region and the layer of insulator using the polycrystalline silicon mask as an etch mask to form a first opening defined by the first portion and a second opening defined by the second portion;
   implanting p-type conductivity determining ions through the first opening and into the first diode region to form a p-type second diode region;
   implanting n-type conductivity determining ions through the second opening and into the first diode region to form an n-type contact region to the first n-type diode region; and
   forming a first electrical contact to the n-type contact region and a second electrical contact to the second diode region.

15. The method of claim 14 further comprising the step of forming a layer of gate dielectric material at least over the second semiconductor layer prior to the step of depositing a layer of polycrystalline silicon and wherein the step of patterning the layer of polycrystalline silicon further comprises the step of patterning the layer of polycrystalline silicon to form a gate electrode overlying the layer of gate dielectric material.

16. The method of claim 14 wherein the step of forming a dielectric isolation region comprises the step of forming a dielectric isolation region including a plurality of dummy active regions formed of the second silicon layer and wherein the step of patterning the layer of polycrystalline silicon comprises the step of forming a polycrystalline silicon mask overlying the dummy active regions.

17. The method of claim 14 wherein the step of patterning the layer of polycrystalline silicon comprises the step of etching the layer of polycrystalline silicon to form first and second concentric portions, the first region formed within and surrounded by the first of the concentric portions and the second region formed between the first and the second of the concentric portions.

18. The method of claim 17 wherein the step of patterning the layer of polycrystalline silicon further comprises the step of etching the layer of polycrystalline silicon to form a third concentric portion defining a third region between the second and third concentric portions, and wherein the method further comprises the steps of:
   etching through the dielectric isolation region and the layer of insulator using the polycrystalline silicon mask as an etch mask to form a third opening defined by the third region;
   implanting p-type conductivity determining impurities through the third opening and into the first semiconductor layer adjacent to the first n-type diode region to form a diode guard ring.

19. The method of claim 14 wherein the step of patterning the layer of polycrystalline silicon comprises the step of etching the layer of polycrystalline silicon to form a frame mask surrounding an area with a plurality of dividing bars extending across the frame mask and dividing the area into a plurality of first areas constituting the first region and a plurality of second areas constituting the second region.

20. The method of claim 19 further comprising the step of implanting p-type conductivity determining impurities into the first semiconductor layer outside the area defined by the frame mask and adjacent to the first n-type diode region to form a diode guard band.

* * * * *